(12) United States Patent
Patil et al.

(10) Patent No.: US 11,393,808 B2
(45) Date of Patent: Jul. 19, 2022

(54) ULTRA-LOW PROFILE STACKED RDL SEMICONDUCTOR PACKAGE

(71) Applicant: QUALCOMM Incorporated, San Diego, CA (US)

(72) Inventors: Aniket Patil, San Diego, CA (US); Hong Bok We, San Diego, CA (US); David Fraser Rae, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 50 days.

(21) Appl. No.: 16/591,374

(22) Filed: Oct. 2, 2019

(65) Prior Publication Data

US 2021/0104507 A1 Apr. 8, 2021

(51) Int. Cl.
*H01L 25/00* (2006.01)
*H01L 23/498* (2006.01)
*H01L 23/00* (2006.01)

(52) U.S. Cl.
CPC ........ *H01L 25/50* (2013.01); *H01L 23/49816* (2013.01); *H01L 24/16* (2013.01); *H01L 24/24* (2013.01); *H01L 24/32* (2013.01); *H01L 24/73* (2013.01); *H01L 2224/13024* (2013.01); *H01L 2224/13147* (2013.01); *H01L 2224/16145* (2013.01); *H01L 2224/24137* (2013.01); *H01L 2224/32145* (2013.01); *H01L 2224/73204* (2013.01)

(58) Field of Classification Search
CPC ... H01L 25/50; H01L 23/49816; H01L 24/16; H01L 24/24; H01L 24/32; H01L 24/73; H01L 2224/13024; H01L 2224/13147; H01L 2224/16145; H01L 2224/24137; H01L 2224/32145; H01L 2224/73204
USPC ........................................... 257/738
See application file for complete search history.

(56) References Cited

U.S. PATENT DOCUMENTS

| 9,691,708 | B1 | 6/2017 | Huang et al. | |
| 2009/0206461 | A1* | 8/2009 | Yoon | H01L 24/73 257/686 |
| 2010/0032196 | A1 | 2/2010 | Kaneko et al. | |
| 2010/0140779 | A1* | 6/2010 | Lin | H01L 23/5389 257/690 |

(Continued)

FOREIGN PATENT DOCUMENTS

EP 3091571 A2 11/2016

OTHER PUBLICATIONS

International Search Report and Written Opinion—PCT/US2020/048872—ISA/EPO—Nov. 20, 2020.

*Primary Examiner* — Dzung Tran
(74) *Attorney, Agent, or Firm* — Muncy, Geissler, Olds & Lowe, P.C./Qualcomm

(57) ABSTRACT

Examples of semiconductor packages with stacked RDLs described herein may include, for example, a first RDL comprising multiple RDL layers coupled to a second RDL comprising multiple RDL layers using copper pillars and an underfill in place of a conventional substrate. The examples herein may use RDLs instead of substrates to achieve smaller design feature size (x, y dimensions reduction), thinner copper layers and less metal usage (z dimension reduction), flexibility to attach semiconductor dies and surface mount devices (SMD) on either side of the package, and less number of built-up RDL layers.

20 Claims, 13 Drawing Sheets

(56) References Cited

U.S. PATENT DOCUMENTS

| | | | |
|---|---|---|---|
| 2010/0246152 A1* | 9/2010 | Lin | H01L 24/92 |
| | | | 361/783 |
| 2012/0049353 A1* | 3/2012 | Osenbach | H01L 25/50 |
| | | | 257/737 |
| 2014/0231984 A1* | 8/2014 | Chen | H01L 21/561 |
| | | | 257/737 |
| 2016/0071779 A1* | 3/2016 | Chen | H01L 21/76895 |
| | | | 257/787 |
| 2016/0218064 A1* | 7/2016 | Kim | H01L 25/50 |
| 2016/0329299 A1* | 11/2016 | Lin | H01L 23/3128 |
| 2019/0237374 A1 | 8/2019 | Huang et al. | |

* cited by examiner

ULTRA-LOW PROFILE STACKED RDL SEMICONDUCTOR PACKAGE

FIELD OF DISCLOSURE

This disclosure relates generally to semiconductor packages, and more specifically, but not exclusively, to semiconductor packages with stacked redistribution layer (RDL).

BACKGROUND

Semiconductors and semiconductor packages are becoming more prevalent in electronic devices. With the increased use of semiconductor packages, the overall package height and performance become more critical design aspects. The current trend of reducing the space occupied by these semiconductor packages, while increasing the number of different types of semiconductor dies and surface mount devices, places more constraints on the dimensions of the package without sacrificing performance improvements. Conventional semiconductor packages, for example, have a large portion of the package height dictated by the substrate on which logic devices are mounted. The usage of a substrate for mounting and signal distribution between the logic devices of the package results in deficiencies including an increased package height.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a semiconductor package comprises: a first redistribution layer (RDL), wherein the first RDL comprises n layers; a second RDL, wherein the second RDL comprises m layers; a connection layer coupled to a first side of the first RDL and a first side the second RDL; a first surface mount device (SMD) coupled to a second side of the first RDL opposite the first side of the first RDL; and a second SMD coupled to a second side of the second RDL opposite the first side of the second RDL.

In another aspect, a semiconductor package comprises: first redistribution means for routing signals, wherein the first redistribution means comprises n layers; second redistribution means for routing signals, wherein the second redistribution means comprises m layers; connection means for connecting layers coupled to a first side of the first redistribution means and a first side the second redistribution means; a first surface mount device (SMD) coupled to a second side of the first redistribution means opposite the first side of the first redistribution means; and a second SMD coupled to a second side of the second redistribution means opposite the first side of the second redistribution means.

In still another aspect, a method for assembling a semiconductor package comprises: attaching a first surface mount device (SMD) on a second side of a first redistribution layer (RDL), wherein the first RDL comprises n layers; attaching a second SMD on a second side of a second RDL, wherein the second RDL comprises m layers; and coupling a connection layer to a first side of the first RDL opposite the second side of the first RDL and a first side of the second RDL opposite the second side of the second RDL.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
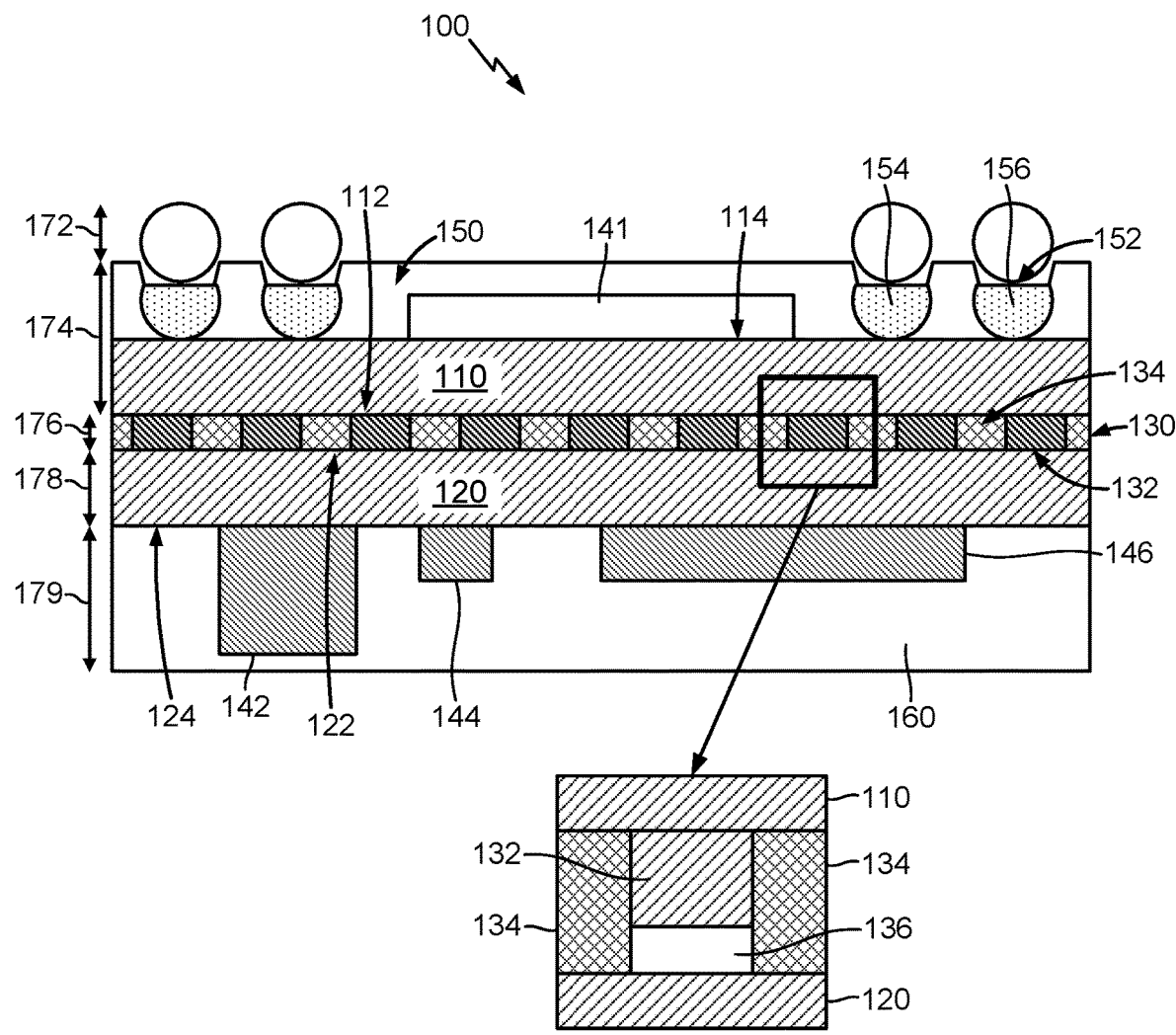
FIG. 1 illustrates an exemplary semiconductor package with copper pillars and solder in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. Examples herein may use RDLs instead of substrates to achieve smaller design feature size (x, y dimensions reduction), thinner copper layers and less metal usage (z dimension reduction), flexibility to attach semiconductor dies and surface mount devices (SMD) on either side of the package, and less number of built-up RDL layers (i.e., a more reliable structure). In some examples, a first RDL comprising multiple RDL layers is coupled to a second RDL comprising multiple RDL layers using copper pillars and an underfill, such as capillary underfill (CUF), non-conductive paste (NCP), non-conductive film (NCF), molded underfill (MUF), or anisotropic conductive film (ACF) instead of a substrate. Logic devices, such as SMDs and semiconductor dies, may be mounted on each of the first RDL and second RDL.

The underfill may allow improved package reliability by preventing the package from failure because of the coefficient of thermal expansion (CTE) mismatch between RDL layers. Filling the gap between the first RDL and the second RDL with non-conductive underfill material has several options with different benefits and disadvantages among the techniques but may require a solder connection in conjunction with the copper pillars. The process of creating electrical conductive adhesive bonds between the first RDL and the second RDL with very fine pitch (<30 micron) may use an ACF bonding process that does not require the addition of solder. The essential characteristics of this process are heating and cooling of the adhesive under pressure. Small, spherical particles are suspended in the adhesive, which can be in the form of foil, flex or paste. Before bonding, the particles are separated by an isolating matrix of adhesive. The parts to be joined are first brought together with the adhesive in between, and tacked (ACF laminating). Temperature, time and pressure are applied and cause plastic deformation of the adhesive and compression of the particles. The particles that are trapped between the copper pillar and the RDL layer form a conductive interface between the pads on the RDL layer and the copper pillar that conducts only in the Z axis. Subsequent cooling and full curing of the adhesive while still in the compressed condition stabilize the joint.

FIG. 1 illustrates an exemplary semiconductor package with copper pillars and solder in accordance with some examples of the disclosure. As shown in FIG. 1, a semiconductor package 100 (e.g., semiconductor package 200, semiconductor package 300, semiconductor package 400, and semiconductor package 500) may include a first RDL 110 comprising n layers, a second RDL 120 comprising m layers, and a connection layer 130 coupled to a first side 112 of the first RDL 110 and a first side 122 of the second RDL 120. The semiconductor package 100 may also include a first SMD 141 coupled to a second side 114 of the first RDL 110 opposite the first side 112 of the first RDL 110, a second SMD 142 coupled to a second side 124 of the second RDL 120 opposite the first side 122 of the second RDL 120, a third SMD 144 on the second side 124 of the second RDL 120, and a fourth SMD 146 on the second side 124 of the second RDL 120. While one SMD is shown on the first RDL 110, it should be understood that more than one SMD may be mounted on the first RDL 110. While three SMDs are shown on the second RDL 120, it should be understood that less or more than three SMDs may be mounted on the second RDL 120. The SMDs may be any logic device, such as a semiconductor die. As shown, the SMDs are coupled to their respective RDL with the active side (the side with active circuitry) facing the RDL and the back side facing away from the RDL.

As shown, the connection layer 130 may include alternating regions of copper pillars 132 and underfill 134. The underfill 134 may be one of a non-conductive film or a non-conductive paste and the regions of copper pillars 132 comprise a copper pillar 132 coupled to first RDL 110 and a solder layer 136 coupled to the second RDL 120.

In addition, the semiconductor package 100 may include a first mold encapsulant 150 on the second side 114 of the first RDL 110 and a second mold encapsulant 160 on the second side 124 of the second RDL 120. The first RDL 110 and the second RDL 120 may comprise multiple layers such that n is greater than 1 and m is greater than 1. The semiconductor package 100 may include a ball grid array 152 coupled to the second side 114 of the first RDL 110 through a copper ball 154 and a solder ball or bump 156. While a ball grid array 152 is shown, it should be understood that there may be other types of external connections, such as a land grid array for example. This may allow a compact or reduce package height (z axis, top to bottom in the view) of less than 1.25 mm, for example. As shown, the package height may include a first distance 172 of the ball grid array 152 of approximately 0.155 mm, a second distance 174 of nL of the first RDL 110 (dependent on the number of n layers), a third distance 176 of the connection layer 130 of approximately 0.025 mm, a fourth distance 178 of mL of the second RDL 120 (dependent on the number of m layers), and a fifth distance 179 of the second mold encapsulant 160 of approximately 0.75 mm.

Figure 2:
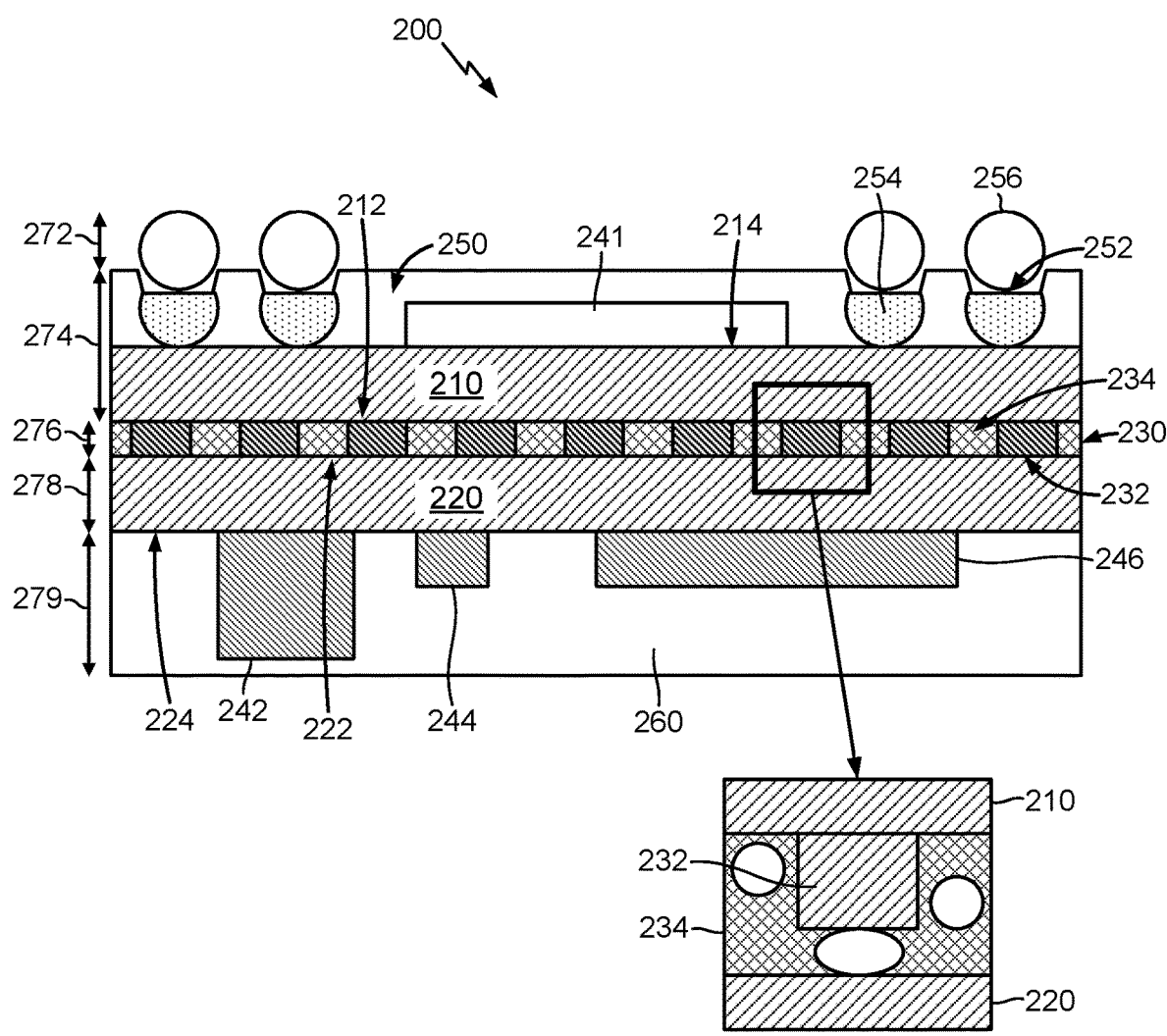
FIG. 2 illustrates an exemplary semiconductor package with copper pillars and ACF in accordance with some examples of the disclosure.

FIG. 2 illustrates an exemplary semiconductor package with copper pillars and ACF in accordance with some examples of the disclosure. As shown in FIG. 2, a semiconductor package 200 (e.g., semiconductor package 100, semiconductor package 300, semiconductor package 400, and semiconductor package 500) may include a first RDL 210 comprising n layers, a second RDL 220 comprising m layers, and a connection layer 230 coupled to a first side 212 of the first RDL 210 and a first side 222 of the second RDL 220. The semiconductor package 200 may also include a first SMD 241 coupled to a second side 214 of the first RDL 210 opposite the first side 212 of the first RDL 210, a second SMD 242 coupled to a second side 224 of the second RDL 220 opposite the first side 222 of the second RDL 220, a third SMD 244 on the second side 224 of the second RDL 220, and a fourth SMD 246 on the second side 224 of the second RDL 220. While one SMD is shown on the first RDL 210, it should be understood that more than one SMD may be mounted on the first RDL 210. While three SMDs are shown on the second RDL 220, it should be understood that less or more than three SMDs may be mounted on the second RDL 220. The SMDs may be any logic device, such as a semiconductor die. As shown, the SMDs are coupled to their respective RDL with the active side (the side with active circuitry) facing the RDL and the back side facing away from the RDL.

As shown, the connection layer 230 may include alternating regions of copper pillars 232 and underfill 234. The underfill 234 may be an anisotropic conductive film and the regions of copper pillars 232 may comprise a copper pillar 232 coupled to first RDL 210 and the underfill 234 may be coupled to the second RDL 220 between the copper pillar 232 and the second RDL 220.

In addition, the semiconductor package 200 may include a first mold encapsulant 250 on second side 214 of the first RDL 210 and a second mold encapsulant 260 on a second side 224 of the second RDL 220. The first RDL 210 and the second RDL 220 may comprise multiple layers such that n is greater than 1 and m is greater than 1. The semiconductor package 200 may include a ball grid array 252 coupled to the second side 214 of the first RDL 210 through a copper ball 254 and a solder ball or bump 256. This may allow a compact or reduce package height (z axis, top to bottom in the view) of less than 1.25 mm, for example. As shown, the package height may include a first distance 272 of the ball grid array 252 of approximately 0.155 mm, a second distance 274 of nL of the first RDL 210 (dependent on the number of n layers), a third distance 276 of the connection layer 230 of approximately 0.025 mm, a fourth distance 278 of mL of the second RDL 220 (dependent on the number of m layers), and a fifth distance 279 of the second mold encapsulant 260 of approximately 0.75 mm.

Figure 3:
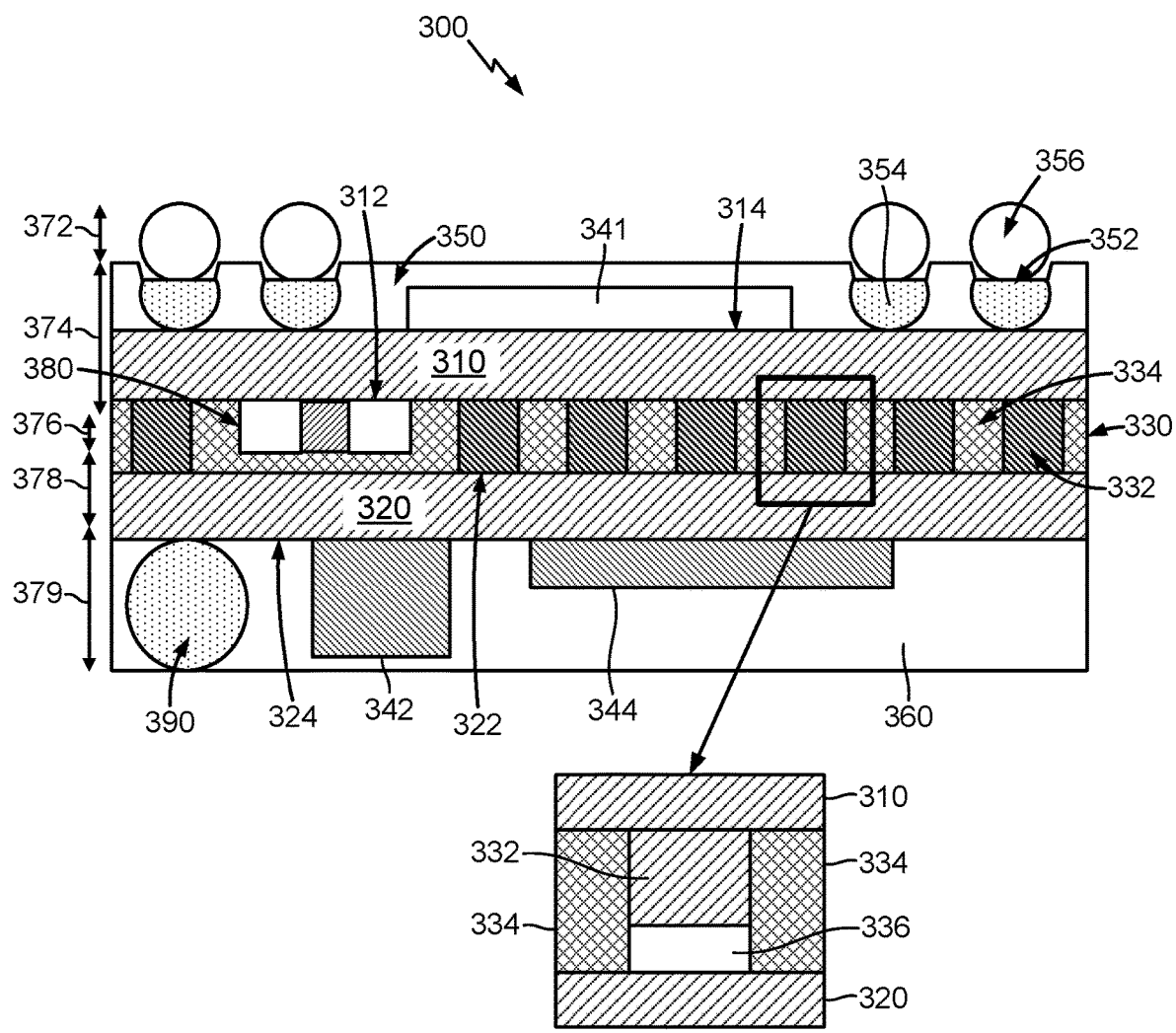
FIG. 3 illustrates an exemplary semiconductor package with a SMD, copper pillars, and solder in accordance with some examples of the disclosure.

FIG. 3 illustrates an exemplary semiconductor package with a SMD, copper pillars, and solder in accordance with some examples of the disclosure. As shown in FIG. 3, a semiconductor package 300 (e.g., semiconductor package 100, semiconductor package 200, semiconductor package 400, and semiconductor package 500) may include a first RDL 310 comprising n layers, a second RDL 320 comprising m layers, and a connection layer 330 coupled to a first side 312 of the first RDL 310 and a first side 322 of the second RDL 320. The semiconductor package 300 may also include a first SMD 341 coupled to a second side 314 of the first RDL 310 opposite the first side 312 of the first RDL 310, a second SMD 342 coupled to a second side 324 of the second RDL 320 opposite the first side 322 of the second RDL 320, and a third SMD 344 on the second side 324 of the second RDL 320. While one SMD is shown on the first RDL 310, it should be understood that more than one SMD may be mounted on the first RDL 310. While two SMDs are shown on the second RDL 320, it should be understood that less or more than two SMDs may be mounted on the second RDL 320. The SMDs may be any logic device, such as a semiconductor die. As shown, the SMDs are coupled to their respective RDL with the active side (the side with active circuitry) facing the RDL and the back side facing away from the RDL.

As shown, the connection layer 330 may include alternating regions of copper pillars 332 and underfill 334. The underfill 334 may be one of a non-conductive film or a non-conductive paste and the regions of copper pillars 332 comprise a copper pillar 332 coupled to the first RDL 310 and a solder layer 336 coupled to the second RDL 320.

In addition, the semiconductor package 300 may include a first mold encapsulant 350 on the second side 314 of the first RDL 310 and a second mold encapsulant 360 on the second side 324 of the second RDL 320. The first RDL 310 and the second RDL 320 may comprise multiple layers such that n is greater than 1 and m is greater than 1. The semiconductor package 300 may include a ball grid array 352 coupled to the second side 314 of the first RDL 310 through a copper ball 354 and a solder ball or bump 356. This may allow a compact or reduce package height (z axis, top to bottom in the view) of less than 1.25 mm, for example. As shown, the package height may include a first distance 372 of the ball grid array 352 of approximately 0.155 mm, a second distance 374 of nL of the first RDL 310 (dependent on the number of n layers), a third distance 376 of the connection layer 330 of approximately 0.025 mm, a fourth distance 378 of mL of the second RDL 320 (dependent on the number of m layers), and a fifth distance 379 of the second mold encapsulant 360 of approximately 0.75 mm.

In addition, the semiconductor package 300 may include a fourth SMD 380 embedded in the connection layer 330, such as a multilayer ceramic capacitor or integrated passive device, and an external connection 390, such as a conductive via, copper pillar, copper ball, or solder ball for external connections in addition to those provided by the ball grid array 352.

Figure 4:
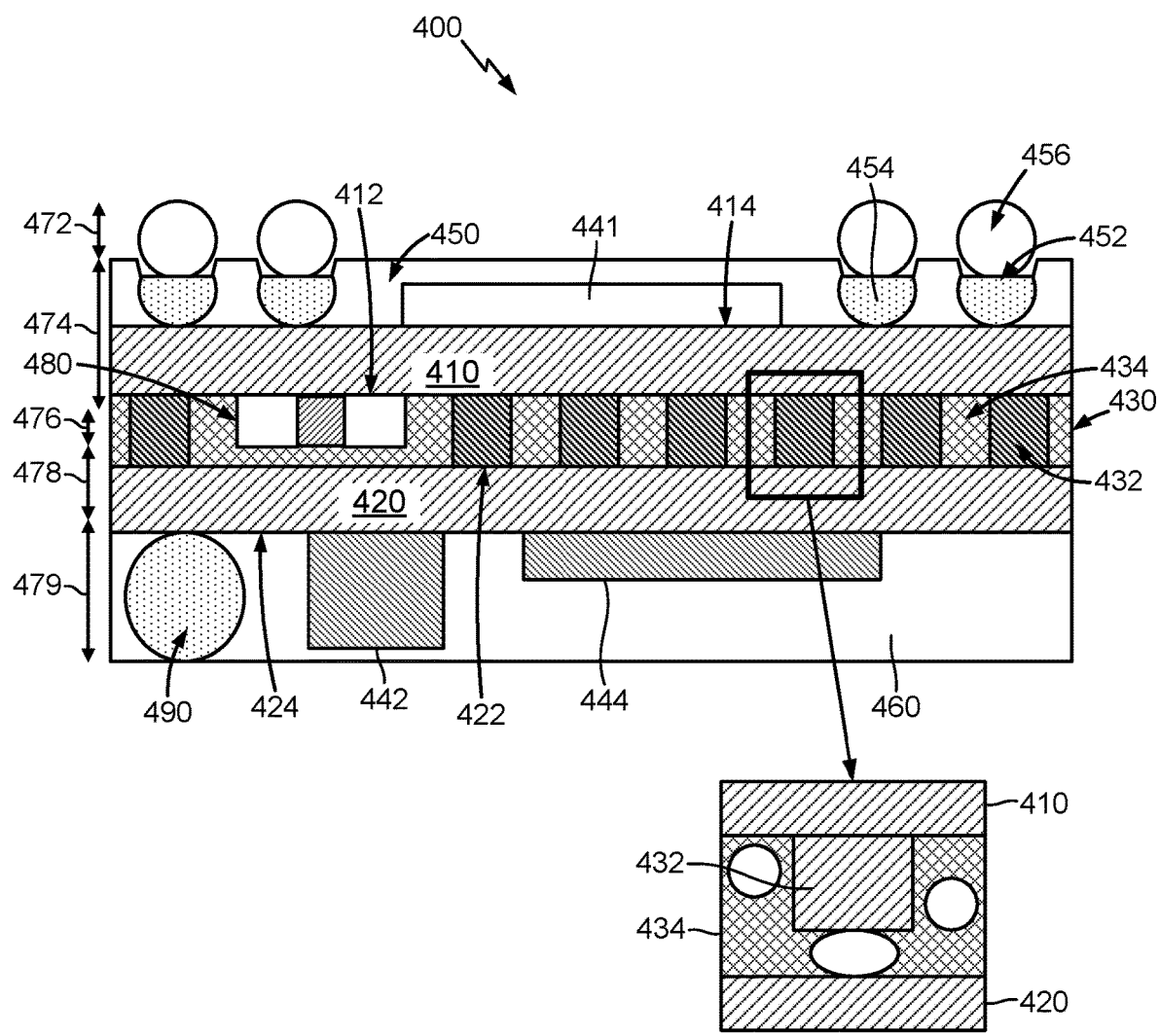
FIG. 4 illustrates an exemplary semiconductor package with a SMD, copper pillars, and ACF in accordance with some examples of the disclosure.

FIG. 4 illustrates an exemplary semiconductor package with a SMD, copper pillars, and ACF in accordance with some examples of the disclosure. As shown in FIG. 4, a semiconductor package 400 (e.g., semiconductor package 100, semiconductor package 200, semiconductor package 300, and semiconductor package 500) may include a first RDL 410 comprising n layers, a second RDL 420 comprising m layers, and a connection layer 430 coupled to a first side 412 of the first RDL 410 and a first side 422 of the second RDL 420. The semiconductor package 400 may also include a first SMD 441 coupled to a second side 414 of the first RDL 410 opposite the first side 412 of the first RDL 410, a second SMD 442 coupled to a second side 424 of the second RDL 420 opposite the first side 422 of the second RDL 420, and a third SMD 444 on the second side 424 of the second RDL 420. While one SMD is shown on the first RDL 410, it should be understood that more than one SMD may be mounted on the first RDL 410. While two SMDs are shown on the second RDL 420, it should be understood that less or more than two SMDs may be mounted on the second RDL 420. The SMDs may be any logic device, such as a semiconductor die. As shown, the SMDs are coupled to their respective RDL with the active side (the side with active circuitry) facing the RDL and the back side facing away from the RDL.

As shown, the connection layer 430 may include alternating regions of copper pillars 432 and underfill 434. The underfill 434 may be an anisotropic conductive film and the regions of copper pillars 432 may comprise a copper pillar 432 coupled to first RDL 410 and the underfill 434 may be coupled to the second RDL 420 between the copper pillar 432 and the second RDL 420.

In addition, the semiconductor package 400 may include a first mold encapsulant 450 on second side 414 of the first RDL 410 and a second mold encapsulant 460 on a second side 424 of the second RDL 420. The first RDL 410 and the second RDL 420 may comprise multiple layers such that n is greater than 1 and m is greater than 1. The semiconductor package 400 may include a ball grid array 452 coupled to the second side 414 of the first RDL 410 through a copper ball 454 and a solder ball or bump 456. This may allow a compact or reduce package height (z axis, top to bottom in the view) of less than 1.25 mm, for example. As shown, the package height may include a first distance 472 of the ball grid array 452 of approximately 0.155 mm, a second distance 474 of nL of the first RDL 410 (dependent on the number of n layers), a third distance 476 of the connection layer 430 of approximately 0.025 mm, a fourth distance 478 of mL of the second RDL 420 (dependent on the number of m layers), and a fifth distance 479 of the second mold encapsulant 460 of approximately 0.75 mm.

In addition, the semiconductor package 400 may include a fourth SMD 480 embedded in the connection layer 430, such as a multilayer ceramic capacitor or integrated passive device, and an external connection 490, such as a conductive via, copper pillar, copper ball, or solder ball for external connections in addition to those provided by the ball grid array 452.

Figure 5A:
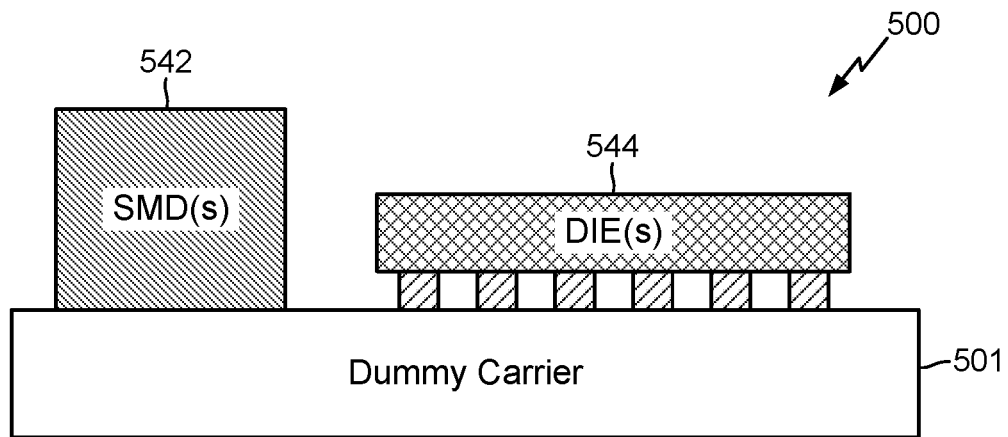
FIGS. 5A-E illustrate an exemplary method for assembling a first portion of a semiconductor package in accordance with some examples of the disclosure.
Figure 5B:
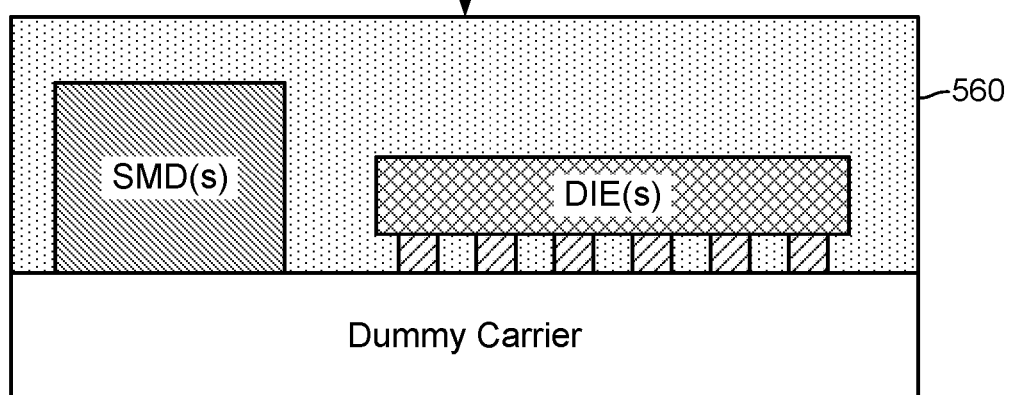
Figure 5C:
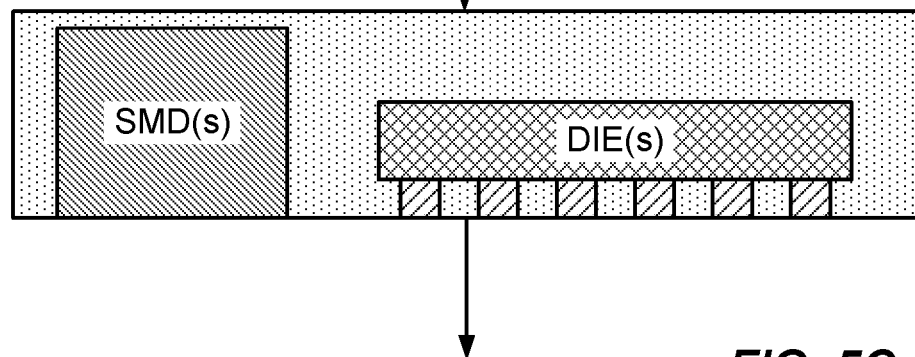
Figure 5D:
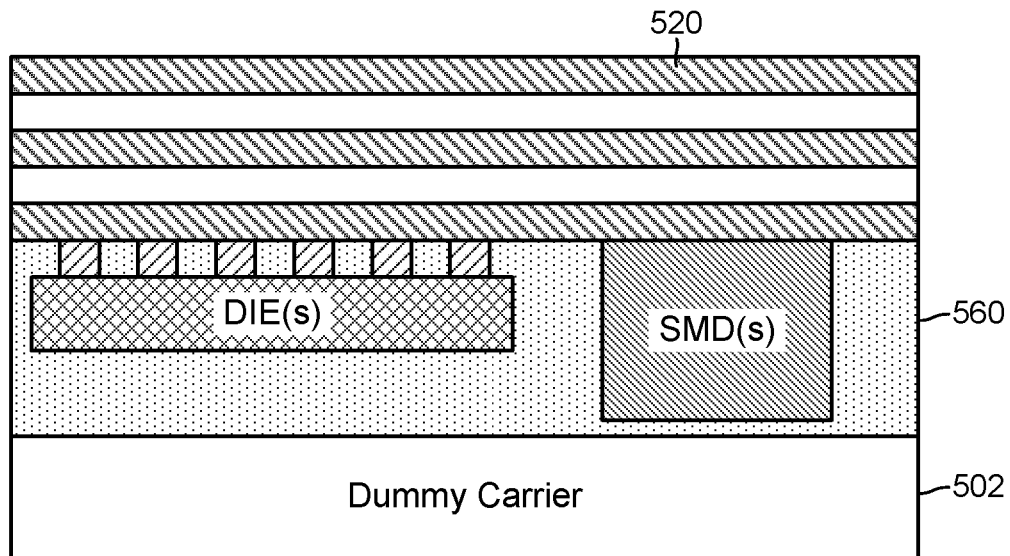
Figure 5E:
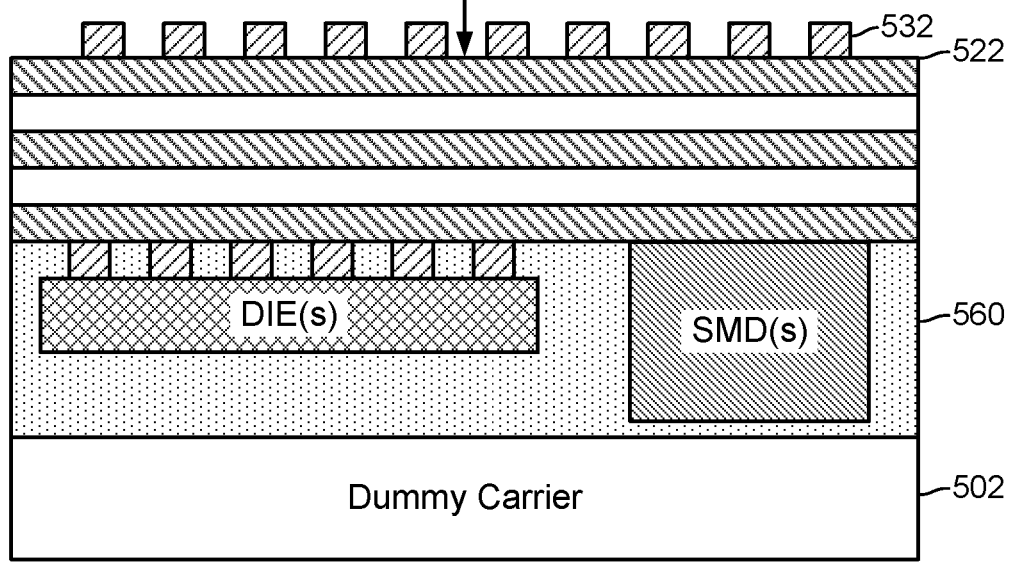

FIGS. 5A-E illustrate an exemplary method for assembling a first portion of a semiconductor package in accordance with some examples of the disclosure. As shown in FIG. 5A, a method for assembling a semiconductor package 500 may include assembling a first portion by placing a second SMD 542 and a third SMD 544 on a dummy carrier 501. As shown in FIG. 5B, the method continues with encapsulating the second SMD 542 and the third SMD 544 with a second mold encapsulant 560. As shown in FIG. 5C, the method continues with back grinding the second mold encapsulant 560 to a desired height and detachment of the dummy carrier 501. As shown in FIG. 5D, the method continues with attaching a second dummy carrier 502 to the back side of the second mold encapsulant 560 and buildup of a second RDL 520 comprising m layers on the active side of the second SMD 542 and the third SMD 544. As shown in FIG. 5E, the method continues with formation of copper pillars 532 on a first side 522 of the second RDL 520 (and solder bump formation on the copper pillars 532 opposite the first side 522 if a non-conductive paste or film is to be used).

Figure 6A:
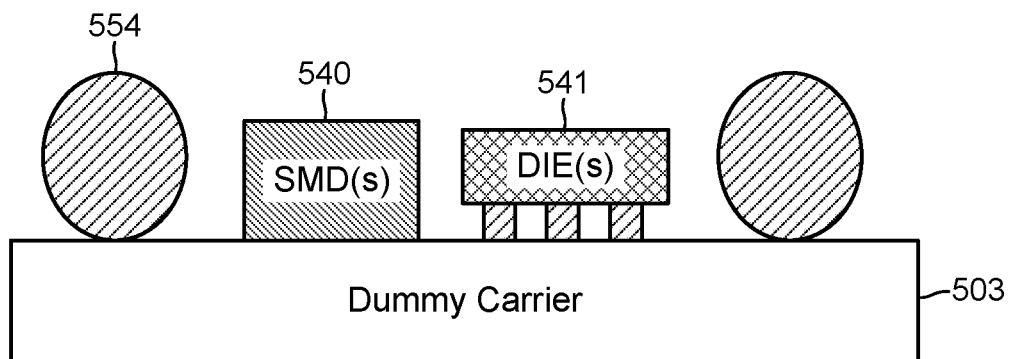
FIGS. 6A-F illustrate an exemplary method for assembling a second portion of a semiconductor package in accordance with some examples of the disclosure.
Figure 6B:
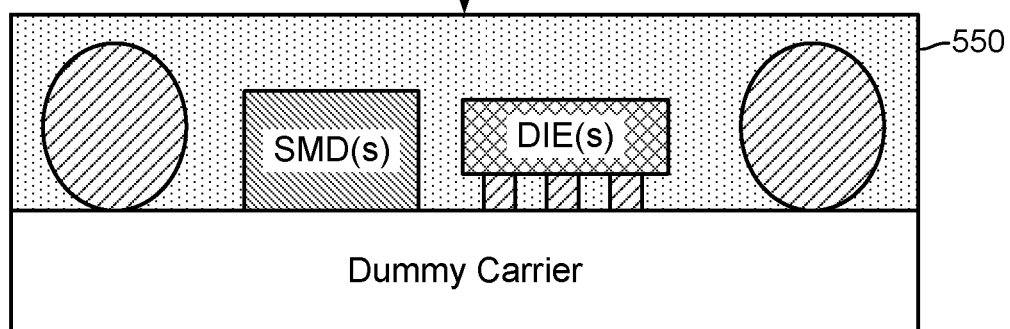
Figure 6C:
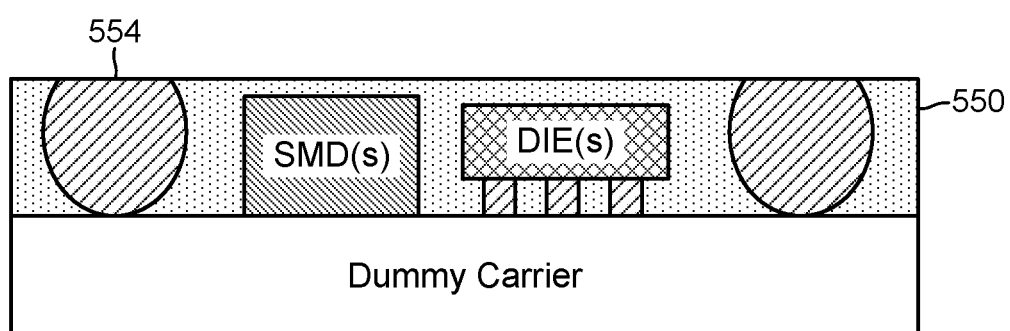
Figure 6D:
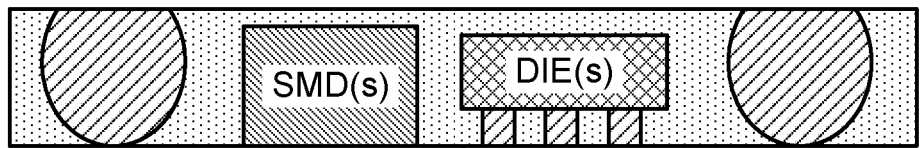
Figure 6E:
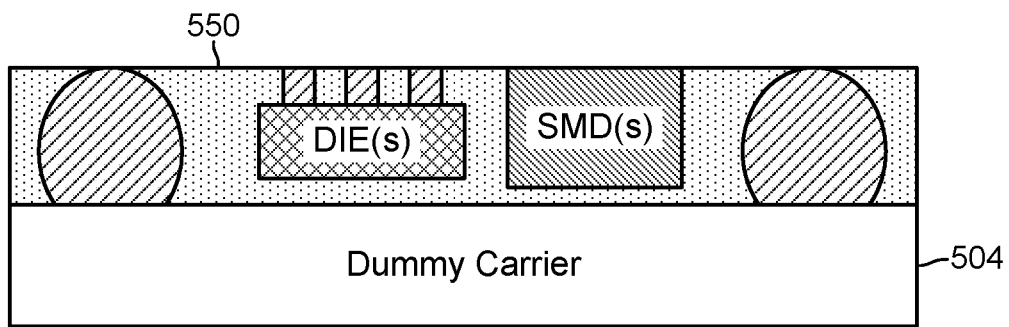
Figure 6F:
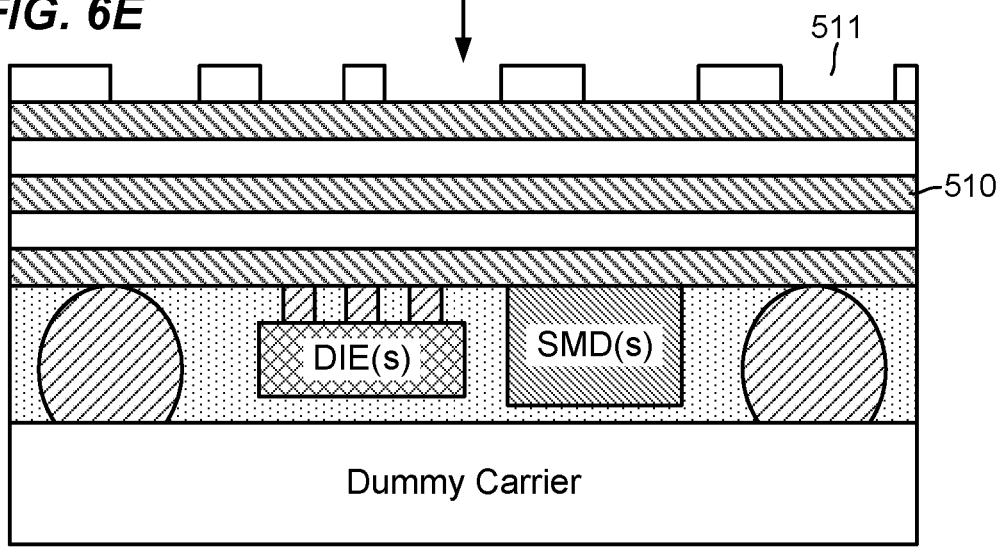

FIGS. 6A-F illustrate an exemplary method for assembling a second portion of a semiconductor package in accordance with some examples of the disclosure. As shown in FIG. 6A, the method continues with assembling a second portion by placing a first SMD 541, a fourth SMD 540, and copper balls 554 on a third dummy carrier 503. As shown in FIG. 6B, the method continues with encapsulating the first SMD 541, the fourth SMD 540, and the copper balls 554 with a first mold encapsulant 550. As shown in FIG. 6C, the method continues with back grinding the first mold encapsulant 550 to reveal copper balls 554. As shown in FIG. 6D, the method continues with detaching the third dummy carrier 503. As shown in FIG. 6E, the method continues with attaching a fourth dummy carrier 504 on the back side of the first mold encapsulant 550. As shown in FIG. 6F, the method continues with buildup of the first RDL 510 comprising n layers on the active side of the first SMD 541 and the fourth SMD 540 along with formation of pad openings corresponding to the location of copper pillars 532 on the first portion of the semiconductor package 500.

Figure 7A:
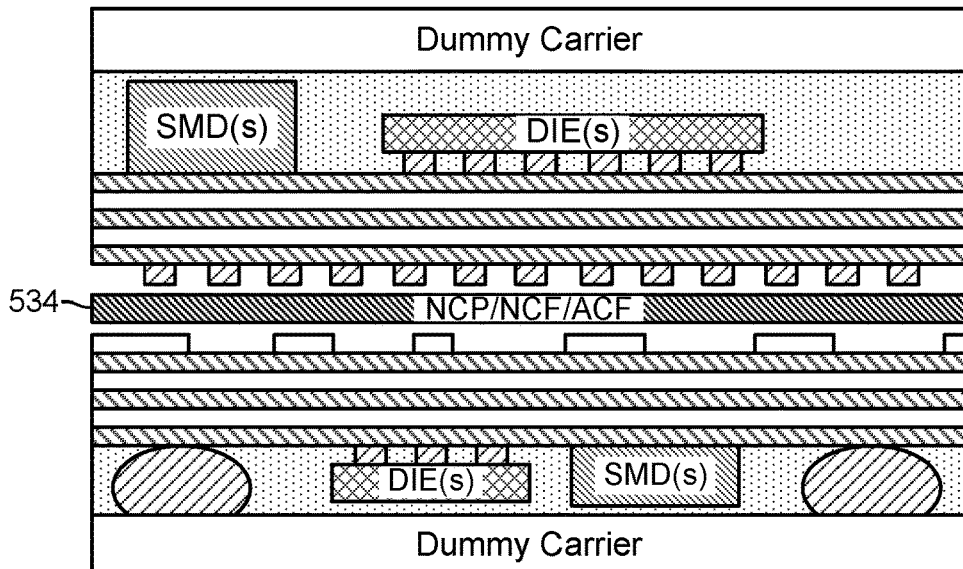
FIGS. 7A-F illustrate an exemplary method for assembling the first portion and the second portion into a semiconductor package in accordance with some examples of the disclosure.
Figure 7B:
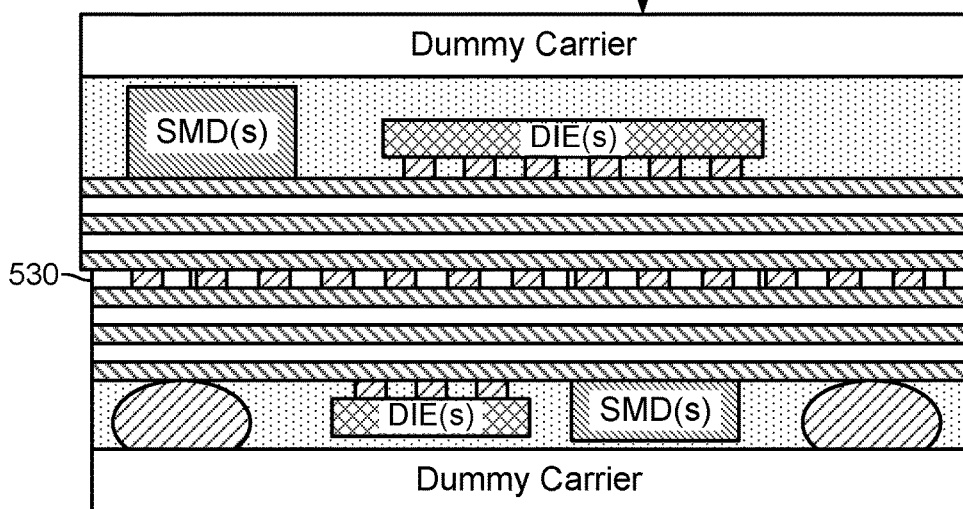
Figure 7C:
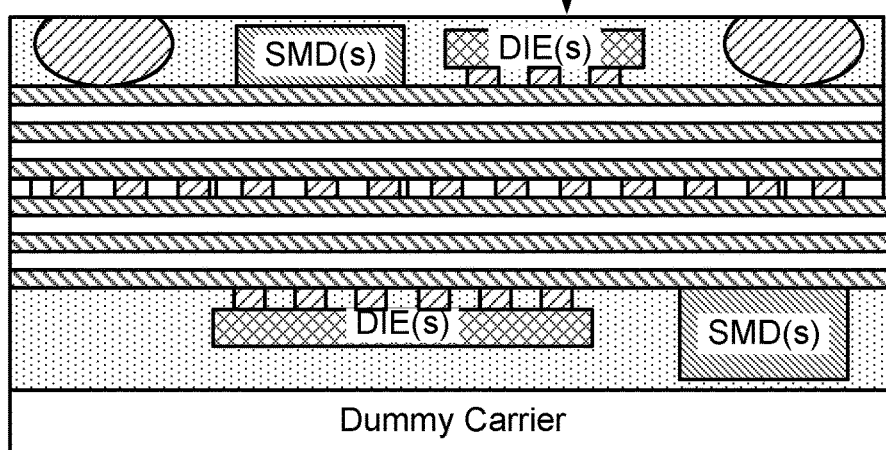
Figure 7D:
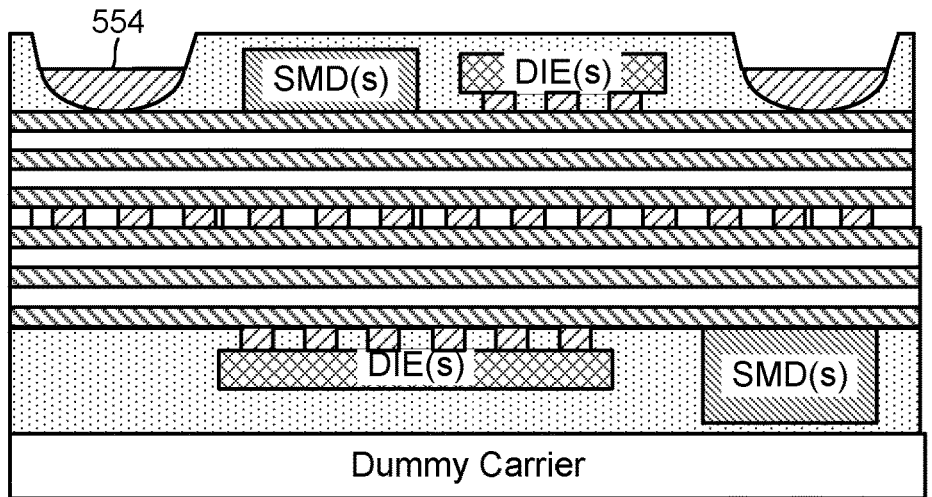
Figure 7E:
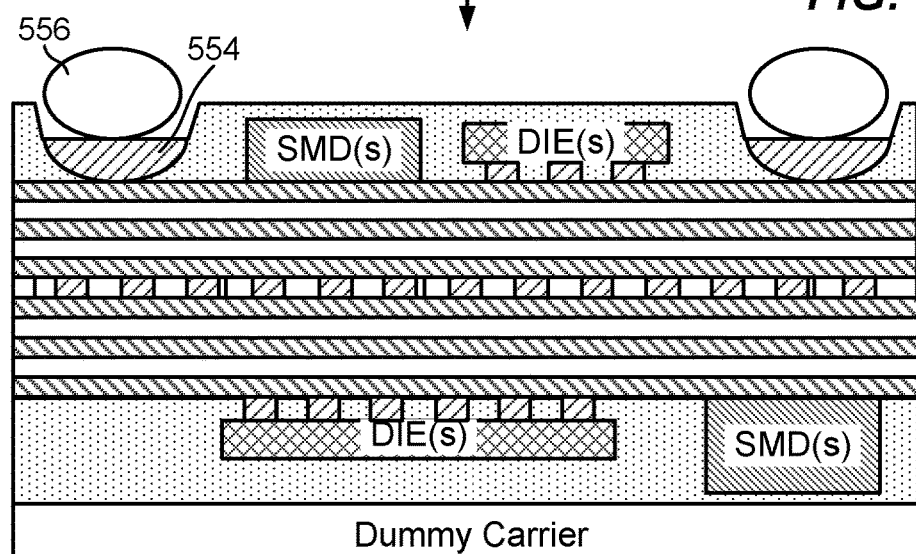
Figure 7F:
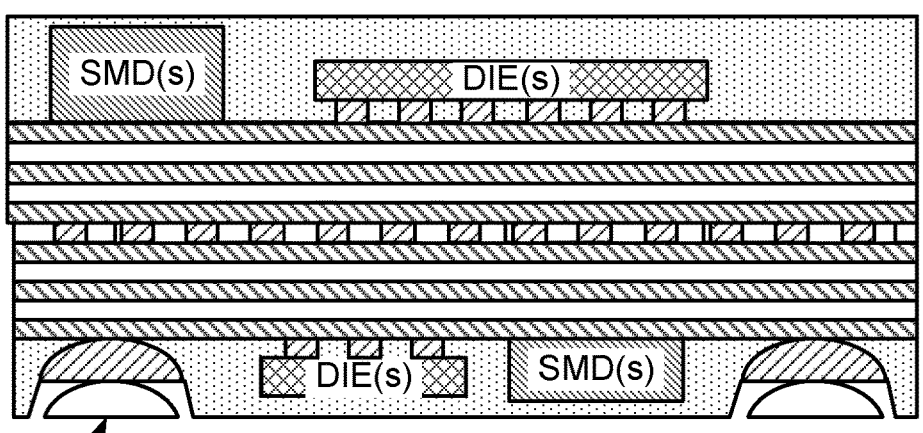

FIGS. 7A-F illustrate an exemplary method for assembling the first portion and the second portion into a semiconductor package in accordance with some examples of the disclosure. As shown in FIG. 7A, the method continues with assembling the first portion and the second portion by applying an underfill 534, such as a non-conductive paste, non-conductive film, or anisotropic conductive film, between the first portion and the second portion. As shown in FIG. 7B, the method continues with attaching the first portion to the second portion to form the connection layer 530 comprising alternating regions of copper pillars 532 (and solder bumps if using a non-conductive underfill) and underfill 534. As shown in FIG. 7C, the method continues with detaching the fourth dummy carrier 504 from the second portion. As shown in FIG. 7D, the method continues with an etching process to reveal the copper balls 554. As shown in FIG. 7E, the method continues with forming solder balls 556 on the revealed copper balls 554 and reflow of the solder balls 556. As shown in FIG. 7F, the method concludes with detaching the second dummy carrier 502 from the first portion. It should be understood that additional SMDs may be added to the semiconductor package 500 by embedding the additional SMDs in the connection layer 530 during the assembly of the two portions. Also, additional external connections may be included for the second portion by adding conductive pillars or vias, such as 390 and 490 for example, during placement of the SMDs on the second portion.

Figure 8:
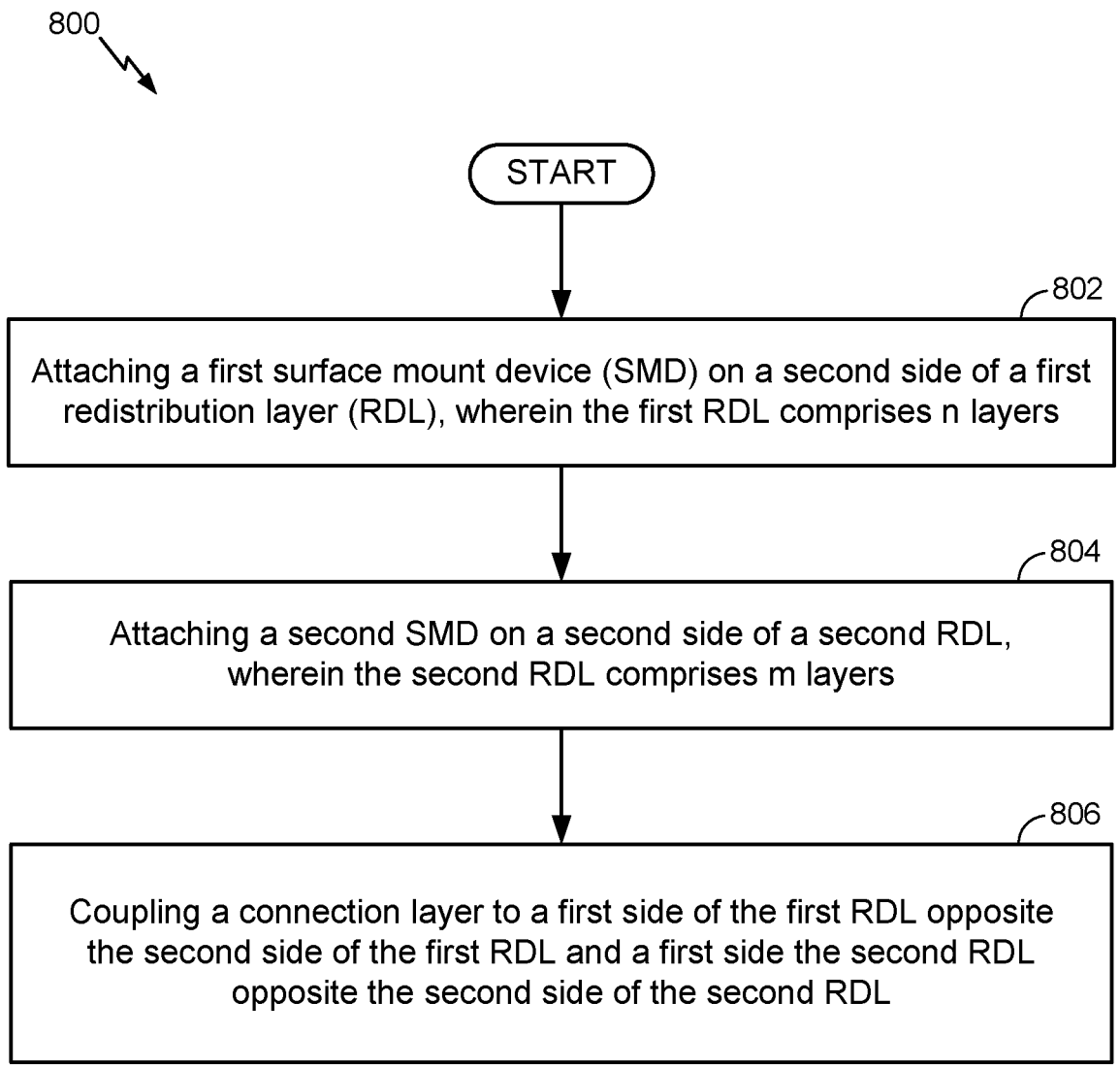
FIG. 8 illustrates an exemplary partial method for assembling a semiconductor package in accordance with some examples of the disclosure.

FIG. 8 illustrates an exemplary partial method for assembling a semiconductor package in accordance with some examples of the disclosure. As shown in FIG. 8, a method 800 for assembling a semiconductor package may being in block 802 with attaching a first surface mount device (SMD) on a second side of a first redistribution layer (RDL), wherein the first RDL comprises n layers. The partial method 800 may continue in block 804 with attaching a second SMD on a second side of a second RDL, wherein the second RDL comprises m layers. The partial method 800 may conclude in block 806 with coupling a connection layer to a first side of the first RDL opposite the second side of the first RDL and a first side the second RDL opposite the second side of the second RDL. The connection layer of block 806 may comprise alternating regions of copper pillars and underfill. In addition, the underfill may be one of a non-conductive film or a non-conductive paste and the regions of copper pillars may comprise a copper pillar coupled to first RDL and a solder layer coupled to the second RDL. Alternatively, the underfill may be an anisotropic conductive film and the regions of copper pillars may comprise a copper pillar coupled to first RDL and the anisotropic conductive film may be coupled to the second RDL between the copper pillar and the second RDL.

Figure 9:
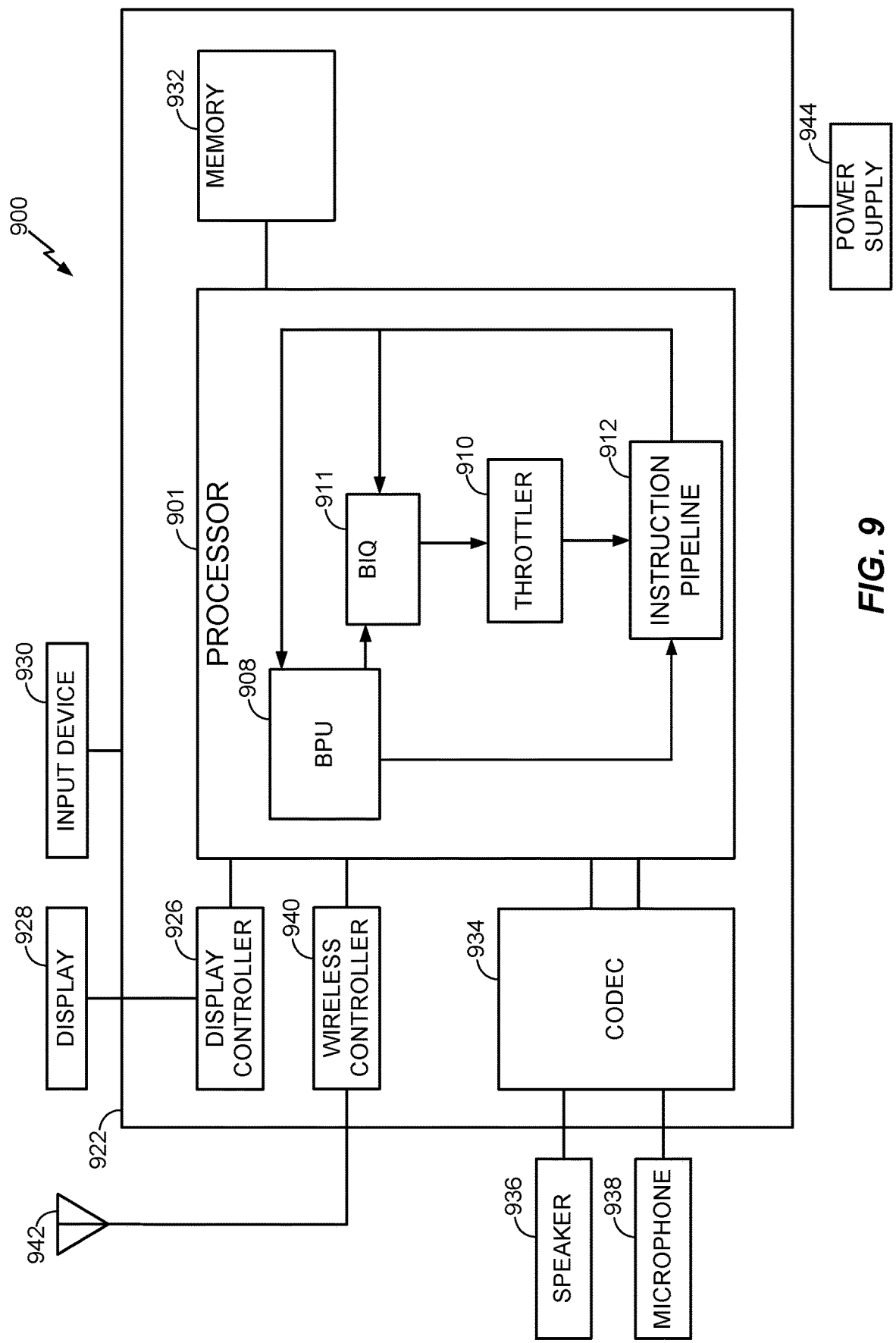
FIG. 9 illustrates an exemplary mobile device in accordance with some examples of the disclosure.

FIG. 9 illustrates an exemplary mobile device in accordance with some examples of the disclosure. Referring now to FIG. 9, a block diagram of a mobile device that is configured according to exemplary aspects is depicted and generally designated 900. In some aspects, mobile device 900 may be configured as a wireless communication device. As shown, mobile device 900 includes processor 901, which may be configured to implement the methods described herein in some aspects. Processor 901 is shown to comprise instruction pipeline 912, buffer processing unit (BPU) 908, branch instruction queue (BIQ) 911, and throttler 910 as is well known in the art. Other well-known details (e.g., counters, entries, confidence fields, weighted sum, comparator, etc.) of these blocks have been omitted from this view of processor 901 for the sake of clarity.

Processor 901 may be communicatively coupled to memory 932 over a link, which may be a die-to-die or chip-to-chip link. Mobile device 900 also include display 928 and display controller 926, with display controller 926 coupled to processor 901 and to display 928.

In some aspects, FIG. 9 may include coder/decoder (CODEC) 934 (e.g., an audio and/or voice CODEC) coupled to processor 901; speaker 936 and microphone 938 coupled to CODEC 934; and wireless controller 940 (which may include a modem) coupled to wireless antenna 942 and to processor 901.

In a particular aspect, where one or more of the above-mentioned blocks are present, processor 901, display controller 926, memory 932, CODEC 934, and wireless controller 940 can be included in a system-in-package or system-on-chip device 922. Input device 930 (e.g., physical or virtual keyboard), power supply 944 (e.g., battery), display 928, input device 930, speaker 936, microphone 938, wireless antenna 942, and power supply 944 may be external to system-on-chip device 922 and may be coupled to a component of system-on-chip device 922, such as an interface or a controller.

It should be noted that although FIG. 9 depicts a mobile device, processor 901 and memory 932 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 10:
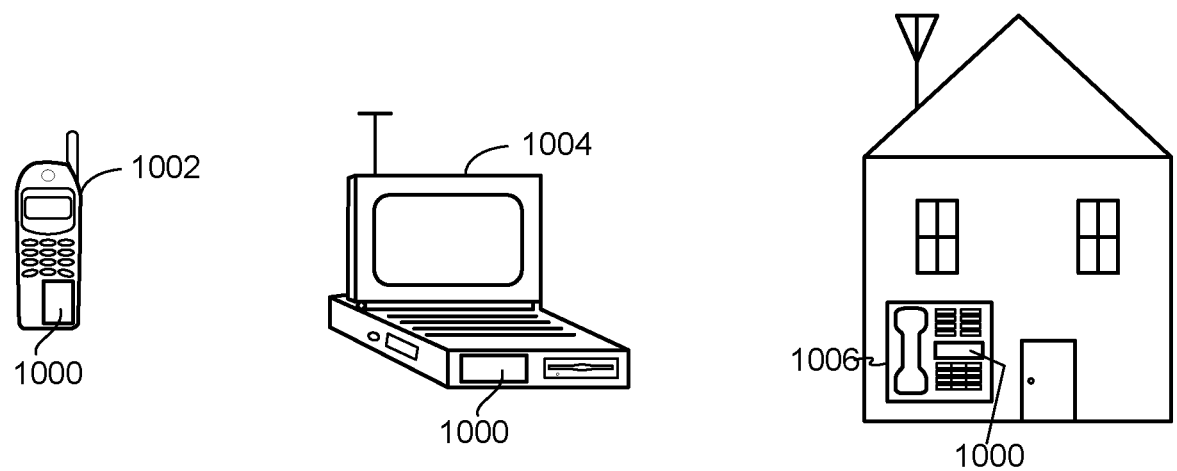
FIG. 10 illustrates various electronic devices that may be integrated with any of the aforementioned integrated device, semiconductor device, integrated circuit, die, interposer, package or package-on-package (PoP) in accordance with some examples of the disclosure.

FIG. 10 illustrates various electronic devices that may be integrated with any of the aforementioned integrated device, semiconductor device, integrated circuit, die, interposer, package or package-on-package (PoP) in accordance with some examples of the disclosure. For example, a mobile phone device 1002, a laptop computer device 1004, and a fixed location terminal device 1006 may include an integrated device 1000 as described herein. The integrated device 1000 may be, for example, any of the integrated circuits, dies, integrated devices, integrated device packages, integrated circuit devices, device packages, integrated circuit (IC) packages, package-on-package devices described herein. The devices 1002, 1004, 1006 illustrated in FIG. 10 are merely exemplary. Other electronic devices may also feature the integrated device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. For example, in one aspect, a semiconductor package (e.g., semiconductor package 100, semiconductor package 200, semiconductor package 300, semiconductor package 400, and semiconductor package 500) may comprise: first redistribution means for routing signals (e.g., first RDL 110, first RDL 210, first RDL 310, first RDL 410, and first RDL 510), wherein the first redistribution means comprises n layers; second redistribution means for routing signals (e.g., second RDL 120, second RDL 220, second RDL 320, second RDL 420, and second RDL 520), wherein the second redistribution means comprises m layers; connection means for connecting layers (e.g., connection layer 130, connection layer 230 connection layer 330 connection layer 430, and connection layer 530) coupled to a first side of the first redistribution means and a first side the second redistribution means; a first surface mount device (e.g., first SMD 141, first SMD 241, first SMD 341, first SMD 441, and first SMD 541) coupled to a second side of the first redistribution means opposite the first side of the first redistribution means; and a second surface mount device (e.g., second SMD 142, second SMD 242, second SMD 342, second SMD 442, and second SMD 542) coupled to a second side of the second redistribution means opposite the first side of the second redistribution means. It will be appreciated that the aforementioned aspects are merely provided as examples and the various aspects claimed are not limited to the specific references and/or illustrations cited as examples.

One or more of the components, processes, features, and/or functions illustrated in FIGS. 1-10 may be rearranged and/or combined into a single component, process, feature or function or incorporated in several components, processes, or functions. Additional elements, components, processes, and/or functions may also be added without departing from the disclosure. It should also be noted that FIGS. 1-10 and its corresponding description in the present disclosure is not limited to dies and/or ICs. In some implementations, FIGS. 1-10 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network.

Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A semiconductor package comprising:
   a first redistribution layer (RDL), wherein the first RDL comprises n layers;
   a second RDL, wherein the second RDL comprises m layers;
   a connection layer coupled to a first side of the first RDL and a first side the second RDL;
   a first surface mount device (SMD) coupled to a second side of the first RDL opposite the first side of the first RDL; and
   a second SMD coupled to a second side of the second RDL opposite the first side of the second RDL,
   wherein an active side of the first SMD faces the second side of the first RDL,
   wherein an active side of the second SMD faces the second side of the second RDL,
   wherein the first and second SMDs are both logic devices,
   wherein the connection layer comprises alternating regions of copper pillars and underfill, and
   wherein at least one copper pillar of the connection layer is not in physical contact with at least one of the first RDL or the second RDL.

2. The semiconductor package of claim 1, further comprising a third SMD in the connection layer.

3. The semiconductor package of claim 1, wherein n is greater than 1 and m is greater than 1.

4. The semiconductor package of claim 1, further comprising a ball grid array coupled to the second side of the first RDL.

5. The semiconductor package of claim 1, wherein the underfill is one of a non-conductive film or a non-conductive paste and the regions of copper pillars comprise a copper pillar coupled to the first RDL and a solder layer coupled to the second RDL.

6. The semiconductor package of claim 1, wherein the underfill is an anisotropic conductive film and the regions of copper pillars comprise a copper pillar coupled to the first RDL and the anisotropic conductive film is coupled to the second RDL between the copper pillar and the second RDL.

7. The semiconductor package of claim 1, wherein the semiconductor package is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

8. A semiconductor package comprising:
   first redistribution means for routing signals, wherein the first redistribution means comprises n layers;
   second redistribution means for routing signals, wherein the second redistribution means comprises m layers;
   connection means for connecting layers coupled to a first side of the first redistribution means and a first side the second redistribution means;
   a first surface mount device (SMD) coupled to a second side of the first redistribution means opposite the first side of the first redistribution means; and
   a second SMD coupled to a second side of the second redistribution means opposite the first side of the second redistribution means,
   wherein an active side of the first SMD faces the second side of the first redistribution means,
   wherein an active side of the second SMD faces the second side of the second redistribution means,
   wherein the first and second SMDs are both logic devices,
   wherein the connection means comprises alternating regions of copper pillars and underfill, and
   wherein at least one copper pillar of the connection means is not in physical contact with at least one of the first redistribution means or the second redistribution means.

9. The semiconductor package of claim 8, further comprising a third SMD in the connection means.

10. The semiconductor package of claim 8, wherein n is greater than 1 and m is greater than 1.

11. The semiconductor package of claim 8, further comprising a ball grid array coupled to the second side of the first redistribution means.

12. The semiconductor package of claim 8, wherein the underfill is one of a non-conductive film or a non-conductive paste and the regions of copper pillars comprise a copper pillar coupled to the first redistribution means and a solder layer coupled to the second redistribution means.

13. The semiconductor package of claim 8, wherein the underfill is an anisotropic conductive film and the regions of copper pillars comprise a copper pillar coupled to the first redistribution means and the anisotropic conductive film is coupled to the second redistribution means between the copper pillar and the second redistribution means.

14. The semiconductor package of claim 8, wherein the semiconductor package is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

15. The semiconductor package of claim 1,
   wherein the active side of the first SMD is in direct contact with the second side of the first RDL such that there is no gap between the active side of the first SMD and the second side of the first RDL, and
   wherein the active side of the second SMD is in direct contact with the second side of the second RDL such that there is no gap between the active side of the second SMD and the second side of the second RDL.

16. The semiconductor package of claim 15, further comprising:
   a first mold encapsulant on the second side of the first RDL, the first mold encapsulant encapsulating all sides of the first SMD other than the active side; and
   a second mold encapsulant on the second side of the second RDL, the second mold encapsulant encapsulating all sides of the second SMD other than the active side.

17. The semiconductor package of claim 8,
   wherein the active side of the first SMD is in direct contact with the second side of the first redistribution means such that there is no gap between the active side of the first SMD and the second side of the first redistribution means, and
   wherein the active side of the second SMD is in direct contact with the second side of the second redistribution means such that there is no gap between the active side of the second SMD and the second side of the second redistribution means.

18. The semiconductor package of claim 15, further comprising:
   a first mold encapsulant on the second side of the first redistribution means, the first mold encapsulant encapsulating all sides of the first SMD other than the active side; and
   a second mold encapsulant on the second side of the second redistribution means, the second mold encapsulant encapsulating all sides of the second SMD other than the active side.

19. The semiconductor package of claim 5,
   wherein the copper pillar is in physical contact with the first RDL and is not in physical contact with the second RDL,
   wherein the solder layer is in physical contact with the second RDL and is not in physical contact with the first RDL, and
   wherein the copper pillar is in physical contact with the solder layer.

20. The semiconductor package of claim 6,
   wherein the copper pillar is in physical contact with the first RDL and is not in physical contact with the second RDL,
   wherein the underfill is in physical contact with the second RDL, and
   wherein the copper pillar is in physical contact with the underfill.

* * * * *